United States Patent
Ahmad et al.

(10) Patent No.: US 9,130,559 B1
(45) Date of Patent: Sep. 8, 2015

(54) PROGRAMMABLE IC WITH SAFETY SUB-SYSTEM

(71) Applicant: Xilinx, Inc., San Jose, CA (US)

(72) Inventors: Sagheer Ahmad, Cupertino, CA (US); Bradley L. Taylor, Santa Cruz, CA (US); Ygal Arbel, Morgan Hill, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/495,024

(22) Filed: Sep. 24, 2014

(51) Int. Cl.
*H03K 19/177* (2006.01)
*H03K 19/003* (2006.01)
*H03K 19/007* (2006.01)
*G06F 15/78* (2006.01)

(52) U.S. Cl.
CPC .......... *H03K 19/003* (2013.01); *G06F 15/7867* (2013.01); *H03K 19/007* (2013.01); *H03K 19/177* (2013.01)

(58) Field of Classification Search
CPC .............. H03K 19/177; G06F 15/7867; G06F 11/0796
USPC ........................................ 326/8, 9, 10, 38, 41
See application file for complete search history.

(56) References Cited

U.S. PATENT DOCUMENTS

| | | | |
|---|---|---|---|
| 5,365,922 A * | 11/1994 | Raemer | 128/204.23 |
| 6,647,301 B1 * | 11/2003 | Sederlund et al. | 700/79 |
| 8,554,953 B1 * | 10/2013 | Sorensen et al. | 710/2 |
| 2008/0147206 A1 * | 6/2008 | Zahrai et al. | 700/19 |
| 2010/0138568 A1 * | 6/2010 | Ost et al. | 710/33 |
| 2011/0209021 A1 * | 8/2011 | Sorensen et al. | 714/733 |

* cited by examiner

*Primary Examiner* — Don Le
(74) *Attorney, Agent, or Firm* — LeRoy D. Maunu (57) ABSTRACT

A programmable IC is disclosed that includes a programmable logic sub-system, a processing sub-system, and a safety sub-system. The programmable logic sub-system includes programmable logic circuits configured to form a hardware portion of a user design. The processing sub-system includes processing circuits configured to execute a software portion of a user design. The safety sub-system is configured to perform a safety functions that detect and/or mitigate errors in circuits of the programmable IC. The safety sub-system includes hard-wired circuits configured to perform hardware-based safety functions for a first subset of circuits of the programmable IC. The safety sub-system also includes a processing circuit configured to execute software-based safety functions for a second subset of circuits of the programmable IC.

20 Claims, 4 Drawing Sheets

PROGRAMMABLE IC WITH SAFETY SUB-SYSTEM

FIELD OF THE INVENTION

The disclosure generally relates to circuits and methods for safety critical applications.

BACKGROUND

Programmable integrated circuits (ICs) are devices that can be programmed to perform specified logic functions. One type of programmable IC, the field programmable gate array (FPGA), typically includes an array of programmable tiles. These programmable tiles comprise various types of logic blocks, which can include, for example, input/output blocks (IOBs), configurable logic blocks (CLBs), dedicated random access memory blocks (BRAM), multipliers, digital signal processing blocks (DSPs), processors, clock managers, delay lock loops (DLLs), bus or network interfaces such as Peripheral Component Interconnect Express (PCIe) and Ethernet and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Some programmable ICs include an embedded processor that is capable of executing program code. The processor can be fabricated as part of the same die that includes the programmable logic circuitry and the programmable interconnect circuitry, also referred to collectively as the "programmable circuitry" of the IC. It should be appreciated that execution of program code within a processor is distinguishable from "programming" or "configuring" the programmable circuitry that may be available on an IC. The act of programming or configuring the programmable circuitry of an IC results in the implementation of different physical circuitry as specified by the configuration data within the programmable circuitry.

SUMMARY

A programmable IC is disclosed that includes a programmable logic sub-system, a processing sub-system, and a safety sub-system. The programmable logic sub-system includes a plurality of programmable logic circuits configured in response to a first subset of configuration data. The processing sub-system includes one or more processing circuits configured to execute a software program in response to a second subset of configuration data. The safety sub-system is configured to perform safety functions to detect and/or mitigate errors in circuits of the programmable IC. The safety sub-system includes a set of hard-wired circuits configured to perform hardware-based safety functions for a first subset of circuits of the programmable IC. The safety sub-system also includes a processing circuit configured to execute software-based safety functions for a second subset of circuits of the programmable IC.

A method is also disclosed for operating a programmable IC. A hardware portion of a user design is operated in a programmable logic sub-system of the programmable IC. A software portion of the user design is executed on a processor sub-system of the programmable IC. Software-based safety functions are performed using a set of processors of a safety sub-system of the programmable IC. Hardware-based safety functions are performed using a set of hard-wired circuits of the safety sub-system. The software-based and hardware-based safety functions are configured to detect and/or mitigate errors in respective circuits of the programmable IC.

Other features will be recognized from consideration of the Detailed Description and Claims, which follow.

BRIEF DESCRIPTION OF THE DRAWINGS

Various aspects and features of the disclosed methods and circuits will become apparent upon review of the following detailed description and upon reference to the drawings in which.

DETAILED DESCRIPTION OF THE DRAWINGS

In some mission critical applications, a programmable IC may be configured to perform one or more mission-critical functions in a programmable logic sub-system or in a processing sub-system. In order to satisfy some high-safety certification standards, such as IEC 61508 SIL3 or ISO-26262 ASILC, separate safety circuits are connected to the programmable IC to ensure correct operation of the mission critical circuits or functions. The safety circuits may be required to comply with strict isolation, protection, and diagnostic-coverage requirements in order to satisfy the high-safety certification standards. The requirements are applied to the entire programmable IC and to an entire device that includes the safety circuits, to ensure that failure of non-mission critical circuits does not affect the ability of the safety system to monitor the mission critical circuits or functions. These requirements can pose a significant burden and lengthen the design process.

In one or more implementations, a programmable IC includes a safety sub-system integrated with a processing sub-system and a programmable logic sub-system. The programmable logic sub-system includes a plurality of programmable logic circuits that may be configured by a first subset of configuration data to form a hardware portion of a user design. The processing sub-system includes one or more processing circuits configured to execute a software portion of a user design included in a second subset of configuration data. The safety sub-system is configured to perform one or more safety functions. Each of the safety functions is configured to detect and/or mitigate errors in a respective one of a plurality of circuits of the programmable IC. The safety functions perform a number of different actions in response to detected errors, such as voltage adjustment, power-down, reset, error signal generation, data backup, switch to redundant/backup system, built-in-self test, etc. In some implementations, a safety function may be configured to reset an individual sub-system in which a localized error has occurred.

The safety sub-system includes a set of hard-wired circuits configured to perform the safety functions for a first subset of the plurality of circuits. The hard-wired circuits are fabricated as part of the die that implements the programmable circuitry of the programmable IC. The safety sub-system also includes a processing circuit configured to execute program code to implement a set of safety functions for a second subset of the plurality of circuits of the programmable IC. For ease of reference, safety functions performed by the hard-wired circuits may be referred to as hardware-based safety functions. Conversely, safety functions executed by the processing circuit may be referred to as software-based safety functions.

In various implementations, the plurality of circuits to be protected and the safety functions employed may be specified in whole or in-part by a user. For instance, a portion of the configuration data may include a safety policy that specifies safety functions to be performed for each of a plurality of circuits of the programmable IC.

The safety functions may provide different levels of protection for different types of circuits of the programmable IC. In some implementations, the configuration data may indicate a priority for each of the circuits to be protected. The safety sub-system may be configured to perform software-based safety functions for low priority circuits and hardware-based safety functions for high priority circuits. Alternatively or additionally, safety functions may check higher priority circuits for correct operation more frequently than lower priority circuits. Some safety functions may be performed by redundant hard-wired circuits of the safety sub-system. For example, the hard-wired circuits of the safety sub-system may include a triple modular redundant circuit configured to monitor a power management unit of the programmable IC.

In some applications, the processing circuit of the safety sub-system includes at least two processors configured to perform a set of software-based safety functions in lockstep. One or more of the safety functions performed by the hard-wired circuits in the safety sub-system may be configured to monitor various circuits to ensure that the two processors are correctly operating in lockstep.

In some implementations, a first group of high-priority circuits critical to lockstep operation of the processors are protected by hardware-based safety functions without use of software diagnostics. The first group of circuits may include, for example, the processors to be operated in lockstep, caches used by the processors, on-chip memory used to store variables referenced by the software executed on the lockstep processors, and interconnects which communicate data between the memory and the processors. For example, a safety function for the memory may monitor integrity of data stored in the memory circuit using an error-correcting code. As another example, a safety function for the caches may be configured to monitor caches used by the processors for correct lockstep operation.

A second group of mid-priority circuits, related to the infrastructure of the programmable IC, may be protected by a mix of hardware-based and software-based safety functions. Some safety functions for the second group may monitor operating parameters, such as clock frequencies, voltage levels, and/or temperature. Some other safety functions for the second group may facilitate isolation of safety critical circuits or functions from other circuits or sub-systems of the programmable IC.

A third group of lower-priority circuits may be protected primarily by software-based safety functions. The third group of lower-priority circuits may include, for example, peripherals that are not utilized by safety critical circuits or functions. Hardware-based safety functions may be used to provide protection for peripherals used by safety critical circuits or functions. Multiple I/O channels and/or I/O loopback capability may also be provided for safety critical peripherals.

In some implementations, the programmable logic sub-system, the processing sub-system, and the safety sub-system may be powered in separate power domains. By using separate power domains, the safety sub-system may continue to operate should a power failure occur in the processing or programmable logic sub-systems. In some implementations, one or more safety functions may take remedial actions in response to power failure in the processing or programmable logic sub-systems. Furthermore, the use of separate power domains may allow the processing or programmable logic sub-systems to be reset independently in response to an unrecoverable error in the sub-system, for example.

In the following description, numerous specific details are set forth to describe specific examples presented herein. It should be apparent, however, that one or more other examples and/or variations of these examples may be practiced without all the specific details given below. In other instances, well known features have not been described in detail so as not to obscure the description of the examples herein.

Figure 1:
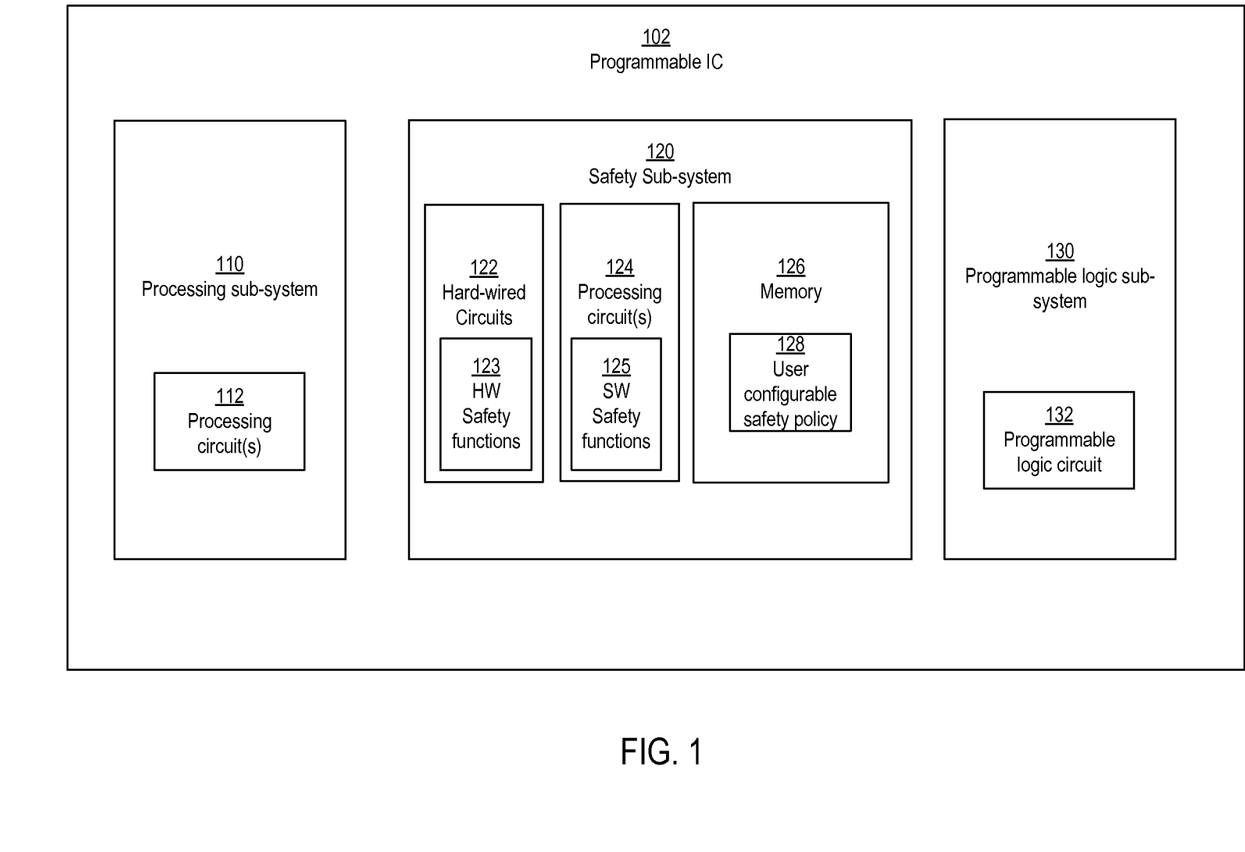
FIG. 1 shows a first programmable IC, consistent with one or more implementations.

Turning now to the figures, FIG. 1 shows a first programmable IC, configured in accordance with one or more implementations. The programmable IC 102 includes a processing sub-system 110, a safety sub-system 120, and a programmable logic sub-system 130. The programmable logic sub-system 130 includes a plurality of programmable logic circuits 132 that may be configured by a first subset of configuration data to form a hardware portion of a user design. The processing sub-system 110 includes one or more processing circuits 112 configured to execute program code of a software portion of a user design included in a second subset of configuration data.

The safety sub-system 120 is configured to perform one or more safety functions, each being configured to detect and/or mitigate errors in a respective circuit of the programmable IC. The safety sub-system 120 includes a set of hard-wired circuits 122 configured to perform hardware-based safety functions 123 for a first set of circuits of the programmable IC. The safety sub-system also includes one or more processing circuits 124 configured to execute a set of software-based safety functions 125 for a second set of circuits of the programmable IC. As indicated previously, the safety functions perform 123 and 125 a number of different actions in response to detected errors. The different actions may include voltage adjustment, power-down, sub-system reset, error signal generation, data backup, switch to redundant/backup system, and/or built-in-self test. In some implementations, the safety functions 123 and 125 to be performed and the circuits to be protected by the safety functions are specified in a safety policy 128 stored in a memory 126 of the sub-system. In some implementations, the memory 126 may be a non-volatile memory configured to store a default safety policy. In some other implementations, the safety policy 128 may be stored in the memory 126 at startup of the programmable IC. In some implementations, the safety policy 128 may be provided or adjusted by a user. For example, the safety policy 128 may be provided in whole or in part in a portion of a set of configuration data used to configure the programmable logic circuits 132 of the programmable logic sub-system 130.

Figure 2:
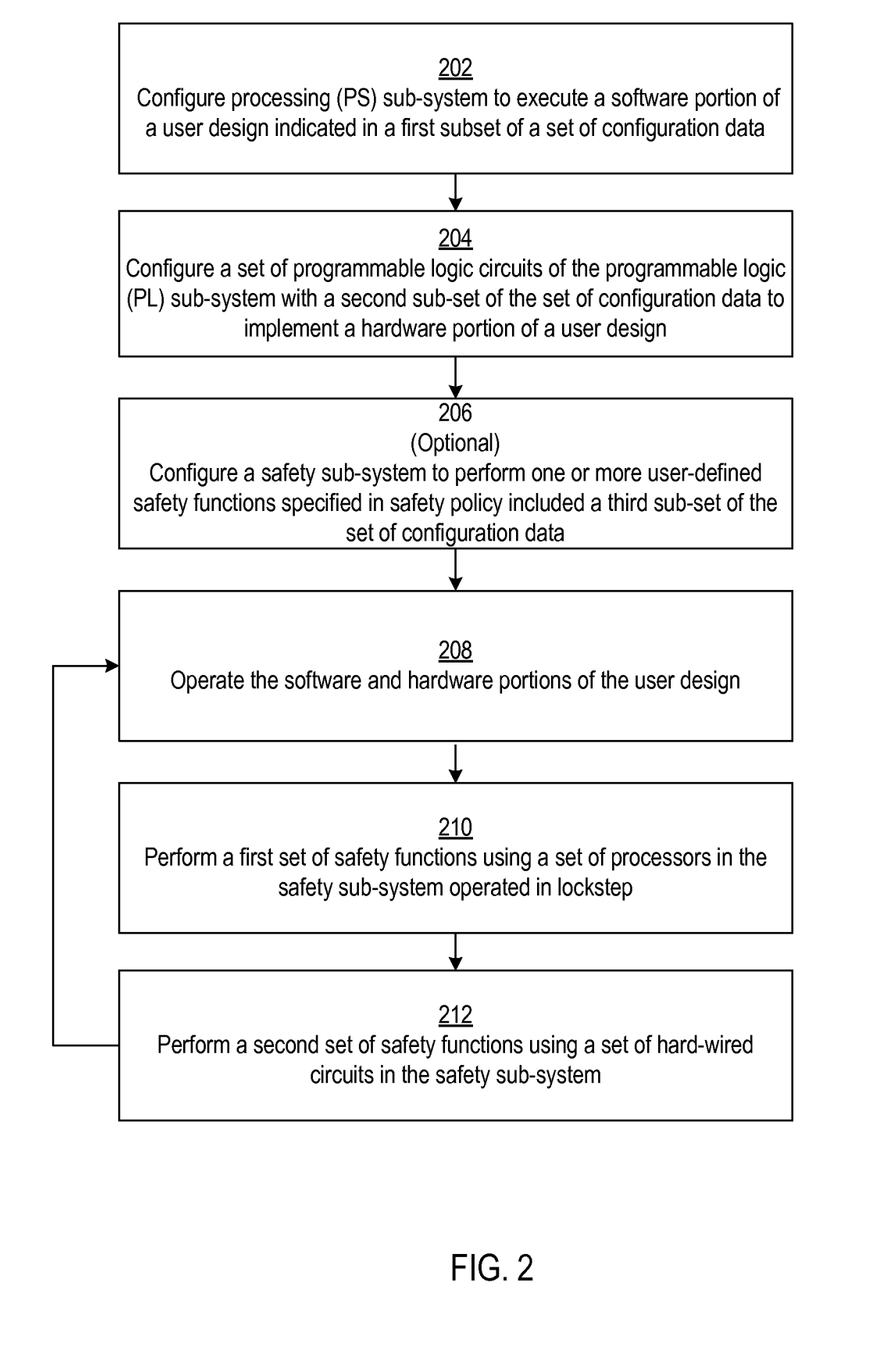
FIG. 2 shows an example process for operating a programmable IC, consistent with one or more implementations.

FIG. 2 shows an example process for operating a programmable IC, consistent with one or more implementations. At block 202, a processing (PS) sub-system is configured to execute a software portion of a user design indicated in a first subset of a set of configuration data. At block 204, a set of programmable logic circuits of a programmable logic (PL) sub-system are programmed with a second subset of the set of configuration data to implement a hardware portion of a user design. Optionally, at block 206, a safety sub-system may be configured to perform one or more user-defined safety functions specified in safety policy included in a third subset of the set of configuration data. Configuration may include, for example, storing the safety policy in a memory of the safety sub-system.

At block 208, the software and hardware portions of the user design are operated. At block 210, a first set of safety functions are performed by a set of processors operated in lockstep in the safety sub-system. The first set of safety functions may include, for example, user defined safety functions (if provided). At block 212, a second set of safety functions are performed by a set of hard-wired circuits in the safety sub-system. For example, one of the second set of safety functions may be configured to ensure that the set of processors in the safety sub-system are correctly operated in lockstep. In some implementations, one or more hard-wired circuits may be configurable to implement one or more user-defined safety functions (if provided). Hard-wired circuits that may be configured to perform user defined safety functions are described in more detail with reference to FIG. 4. The safety functions continue to be performed at blocks 210 and 212 while the software and hardware portions of the user design continue to be operated at block 208.

Figure 3:
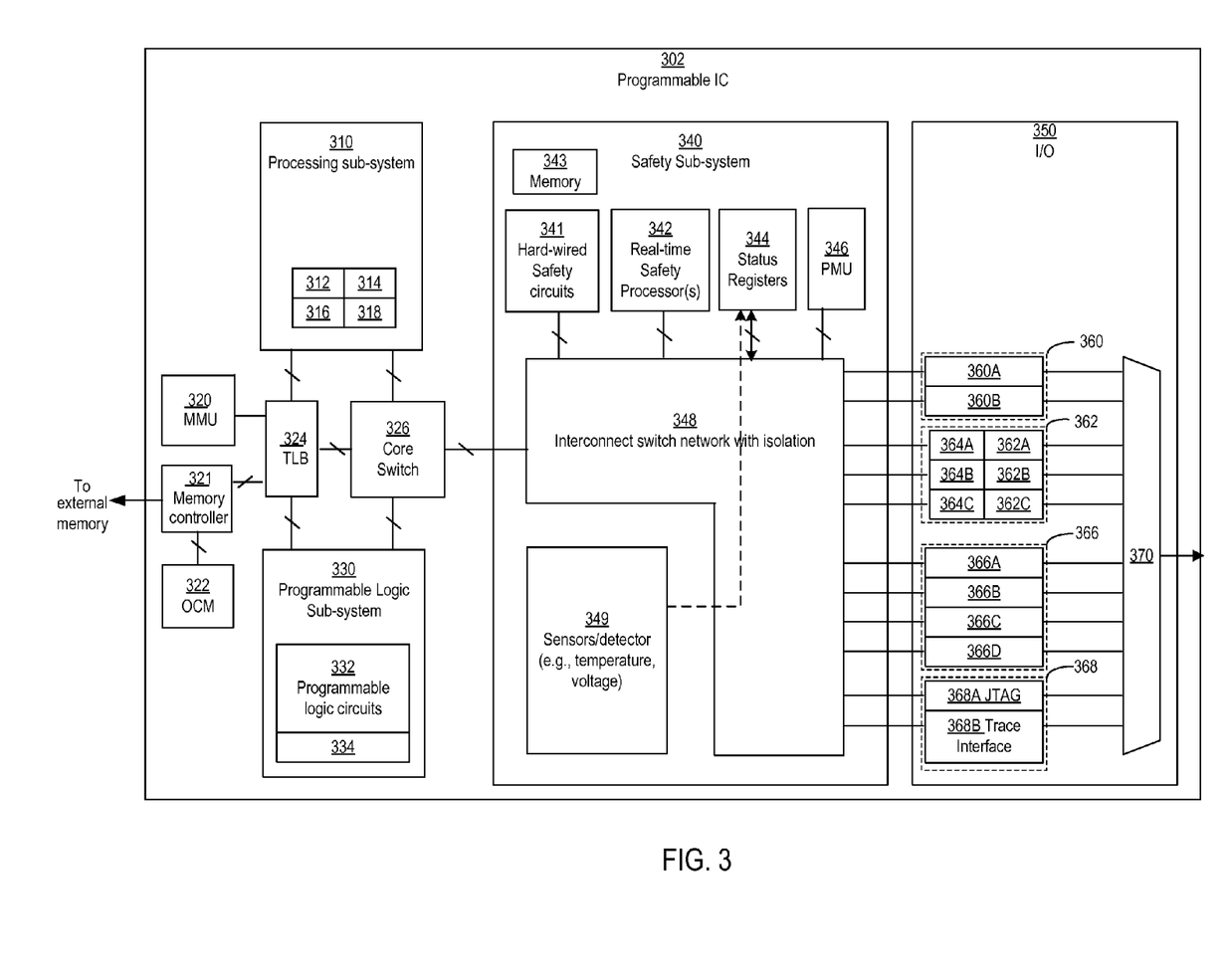
FIG. 3 shows a second programmable IC, consistent with one or more implementations.

FIG. 3 shows a programmable IC 302 that may be configured in accordance with one or more implementations. The programmable IC may also be referred to as a System-on-chip (SOC), which includes a processing sub-system 310 and a programmable logic sub-system 330. The processing sub-system 310 may be programmed to implement a software portion of the user design, via execution of a user program. The program may be specified as part of a configuration data stream or may be retrieved from an on-chip or off-chip data storage device. The processing sub-system 310 may include various circuits 312, 314, 316, and 318 for executing one or more software programs. The circuits 312, 314, 316, and 318 may include, for example, one or more processor cores, floating point units (FPUs), an interrupt processing unit, on chip-memory, memory caches, and/or a cache coherent interconnect.

The programmable logic sub-system 330 of the programmable IC 302 may be programmed to implement a hardware portion of a user design. For instance, the programmable logic sub-system may include a number of programmable logic circuits 332, which may be programmed to implement a set of circuits specified in a configuration data stream. The programmable logic circuits 332 include programmable interconnect circuits, programmable logic circuits, and configuration memory cells. The programmable logic implements the logic of a user design using programmable elements that can include, for example, function generators, registers, arithmetic logic, and so forth. Programmable interconnect circuits may include a large number of interconnect lines of varying lengths interconnected by programmable interconnect points (PIPs).

The programmable logic circuits 332 may be programmed by loading a configuration data stream into the configuration memory cells, which define how the programmable interconnect circuits and programmable logic circuits are configured. The collective states of the individual memory cells then determine the function of the programmable logic circuits 332. The configuration data can be read from memory (e.g., from an external PROM) or written into the programmable IC 302 by an external device. In some implementations, configuration data may be loaded into configuration memory cells by a configuration controller 334 included in the programmable logic sub-system 330. In some other implementations, the configuration data may be loaded into the configuration memory cells by a start-up process executed by the processing sub-system 310.

The programmable IC 302 may include various circuits to interconnect the processing sub-system 310 with circuitry implemented within the programmable logic sub-system 330. In this example, the programmable IC 302 includes a core switch 326 that can route data signals between various data ports of the processing sub-system 310 and the programmable logic sub-system 330. The core switch 326 may also route data signals between either of the programmable logic or processing sub-systems 310 and 330 and various other circuits of the programmable IC, such as an internal data bus. Alternatively or additionally, the processing sub-system 310 may include an interface to directly connect with the programmable logic sub-system—bypassing the core switch 326. Such an interface may be implemented, for example, using the AMBA AXI Protocol Specification (AXI) as published by ARM.

In some implementations, the processing sub-system 310 and the programmable logic sub-system 330 may also read or write to memory locations of an on-chip memory 322 or off-chip memory (not shown) via memory controller 321. The memory controller 321 can be implemented to communicate with one or more different types of memory circuits including, but not limited to, Dual Data Rate (DDR) 2, DDR3, Low Power (LP) DDR2 types of memory, whether 16-bit, 32-bit, 16-bit with ECC, etc. The list of different memory types with which memory controller 321 is able to communicate is provided for purposes of illustration only and is not intended as a limitation or to be exhaustive. As shown in FIG. 3, the programmable IC 302 may include a memory management unit 320 and translation look-aside buffer 324 to translate virtual memory addresses used by the sub-systems 310 and 330 to physical memory addresses used by the memory controller 321 to access specific memory locations.

The programmable IC may include an input/output (I/O) sub-system 350 for communication of data with external circuits. The I/O sub-system 350 may include various types of I/O devices or interfaces including for example, flash memory type I/O devices, higher performance I/O devices, lower performance interfaces, debugging I/O devices, and/or RAM I/O devices.

The I/O sub-system 350 may include one or more flash memory interfaces 360 illustrated as 360A and 360B. For example, one or more of flash memory interfaces 360 can be implemented as a Quad-Serial Peripheral Interface (QSPI) configured for 4-bit communication. One or more of flash memory interfaces 360 can be implemented as a parallel 8-bit NOR/SRAM type of interface. One or more of flash memory interfaces 360 can be implemented as a NAND interface configured for 8-bit and/or 16-bit communication. It should be appreciated that the particular interfaces described are provided for purposes of illustration and not limitation. Other interfaces having different bit widths can be used.

The I/O sub-system 350 can include one or more interfaces 362 providing a higher level of performance than flash memory interfaces 360. Each of interfaces 362A-362C can be coupled to a DMA controller 364A-364C respectively. For example, one or more of interfaces 362 can be implemented as a Universal Serial Bus (USB) type of interface. One or more of interfaces 362 can be implemented as a gigabit Ethernet type of interface. One or more of interfaces 362 can be implemented as a Secure Digital (SD) type of interface.

The I/O sub-system 350 may also include one or more interfaces 366 such as interfaces 366A-366D that provide a lower level of performance than interfaces 362. For example, one or more of interfaces 366 can be implemented as a General Purpose I/O (GPIO) type of interface. One or more of interfaces 366 can be implemented as a Universal Asynchronous Receiver/Transmitter (UART) type of interface. One or more of interfaces 366 can be implemented in the form of a Serial Peripheral Interface (SPI) bus type of interface. One or more of interfaces 366 can be implemented in the form of a Controller-Area-Network (CAN) type of interface and/or an I²C type of interface.

The I/O sub-system 350 can include one or more debug interfaces 368 such as processor JTAG (PJTAG) interface 368A and a trace interface 368B. PJTAG interface 368A can provide an external debug interface for the programmable IC 302. Trace interface 368B can provide a port to receive debug, e.g., trace, information from the processing sub-system 310 or the programmable logic sub-system 330.

As shown, each of interfaces 360, 362, 366, and 368 can be coupled to a multiplexer 370. Multiplexer 370 provides a plurality of outputs that can be directly routed or coupled to external pins of the programmable IC 302, e.g., balls of the package within which the programmable IC 302 is disposed. For example, I/O pins of programmable IC 302 can be shared among interfaces 360, 362, 366, and 368. A user can configure multiplexer 370, via a configuration data stream to select which of interfaces 360-368 are to be used and, therefore, coupled to I/O pins of programmable IC 302 via multiplexer 370. The I/O sub-system 350, may also include a fabric multiplexer I/O (FMIO) interface (not shown) to connect interfaces 362-368 to programmable logic circuits of the programmable logic sub-system. Additionally or alternatively, the programmable logic sub-system 330 can be configured to implement one or more I/O circuits within programmable logic. In some implementations, the programmable IC 302 may also include a sub-system 340 having various circuits for power and/or safety management. For example, the sub-system 340 may include a power management unit 346 configured to monitor and maintain one or more voltage domains used to power the various sub-systems of the programmable IC 302. In some implementations, the power management unit 346 may disable power of individual sub-systems, when idle, to reduce power consumption, without disabling power to sub-systems in use.

The sub-system 340 may also include safety circuits to monitor the status of the sub-systems to ensure correct operation. For instance, the sub-system 340 may include one or more hard-wired safety circuits 341 configured to perform safety functions for various sub-systems or circuits of the programmable IC. The sub-system 340 may also include one or more real-time processors 342 configured to execute various software-based safety functions for various sub-systems or circuits of the programmable IC.

The sub-system 340 may include one or more sensors or detectors 349 configured to monitor various operating parameters of the programmable IC (e.g., voltage, temperature, clocks and/or data/control signals) and store data indicating the status of the monitored operating parameters in status registers 344. The status registers may be accessed, by the hard-wired safety circuits 341, real-time processors 342, or power management unit 346.

The safety functions may monitor the status of the various sub-systems and perform various actions to facilitate detection, prevention, and/or mitigation of errors in one or more sub-systems or circuits. In some implementations, the safety functions may take action in response to the status registers having values indicative of an error. For example, a safety function may generate an alert in response to detecting an error. As another example, a safety function may reset an individual sub-system to attempt to restore the sub-system to correct operation.

Sub-systems or circuits to be protected and the safety function to be performed may be specified in a safety policy stored in a memory 343. The safety policy may provide different levels of protection for different sub-systems or circuits of the programmable IC 302. For example, high priority circuits/functions (e.g., user of the programmable IC) may be protected by a safety function implemented by dedicated hard-wired safety circuits 341 or by two of the real-time safety processors operated in lock-step 342. Lower priority circuits (e.g., peripherals) may be protected by software-based tests that are periodically performed to test functionality of the lower priority circuits.

The safety policy may be hardcoded in a non-volatile memory or may be stored in the memory at startup. In some implementations, the safety policy may be user configurable and provided, for example, in a subset of a set of configuration data.

The sub-system 340 includes an interconnect switch network 348 that may be used to interconnect various sub-systems. For example, the interconnect switch network 348 may be configured to connect the various sub-systems 310, 330, and 340 to various interfaces of the I/O sub-system 350. In some applications, the interconnect switch network 348 may also be controlled by one or more safety functions of the hard-wired safety circuits 341 or real-time safety processors 342 to isolate the real-time processors 342 from the sub-systems that are to be monitored. Such isolation may be required by certain application standards (e.g., IEC-61508 SIL3 or ISO-26262 standards) to ensure that the real-time processors 342 are not affected by errors that occur in other sub-systems. In some applications, interconnect switch network 348 may also be protected (e.g., by ECC or parity) to provide protection against random faults. In some applications, the interconnect switch network 348 may be protected by software-based tests that are periodically performed to test the interconnect switch network 348.

In some implementations, some safety functions may be performed by redundant hard-wired circuits of the hard-wired safety circuits 341. For example, the power management unit 346 may be protected by a safety function performed by a triple modular redundant circuit of the hard-wired safety circuits 341. For example, the hard-wired circuits of the safety sub-system may include a triple modular redundant circuit configured to monitor a power management unit of the programmable IC. As another example, the programmable IC may include a configuration security unit configured to prevent unintended reconfiguration of programmable logic circuits (e.g., during reset of the processing sub-system 310). The configuration security unit may similarly be protected by triple modular redundant circuits.

Figure 4:
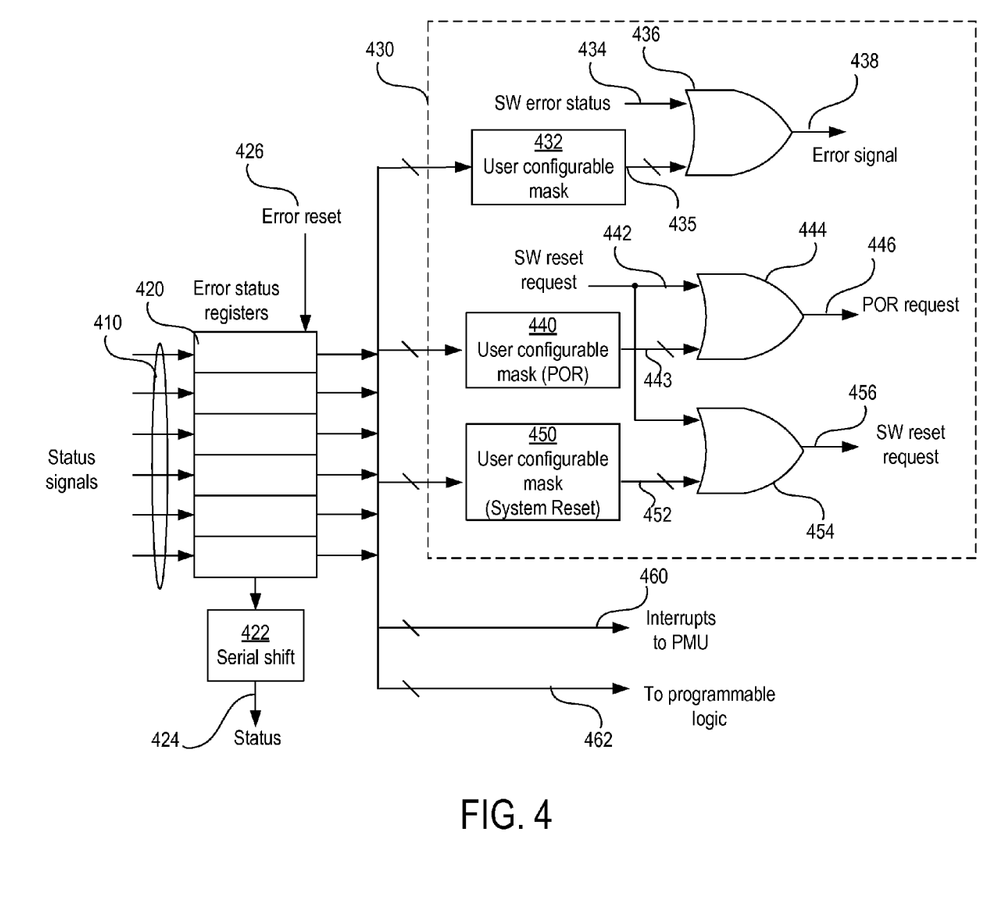
FIG. 4 shows an example system for user configurable error handling that may be included in a safety sub-system of a programmable IC.

FIG. 4 shows an example system for user configurable error handling that may be included in the safety system in one or more implementations. The system includes a set of error status registers 420, each configured to receive a respective status signal of a set of status signals 410. The error status registers 420 are configured to store and maintain errors indicated by the status signals 410 until the errors are cleared by an error reset signal 426. For instance, in some implementations, the status signals may each indicate a logical 0 value if no error is present and indicate a logical 1 value if an error is present. When reset by the error reset signal 426, the values of all of the error status registers may be set to logical 0, indicating no error is present. In response to one of the status signals 410 indicating an error, the value of a corresponding one of the error status registers 420 is set to a logical 1. The logical 1 value is maintained by the register even if the status signal later returns to a logical 0 value. By maintaining the values indicative of error in the error status registers 420, the errors may be more easily processed by error handling circuitry, for example. For instance, as errors are maintained in the error status registers 420, error handling circuitry may retrieve/receive values of the error status registers 420 less frequently without missing occurrences of intermittent errors.

The values of the error status registers 420 are output in parallel for error handling and/or monitoring by various circuits that may be included in the system. For example, the values of the error status registers 420 are provided as parallel error signals 462 to a programmable logic sub-system for processing by user-defined circuits implemented therein. A user may program the programmable logic, via a set of configuration data, to implement a customized error handling circuit. The error handling circuit may be configured by a user to perform a number of different actions in response to various combinations of errors indicated by the error status registers 420. For instance, error handling circuitry defined by a user may trigger one or more system-wide actions such as reset, shutdown, and/or alert. Alternatively or additionally, the error handling circuitry defined by a user may cause user-defined circuits implemented in the programmable logic to perform one or more actions. For instance, in response to an error, the error handling circuit may trigger circuits implemented in programmable logic to perform a built-in-self-test to determine if the circuits are operating correctly. Similarly, in some implementations, the parallel error signals 462 may be provided to a software-based error handling routine that is executed on a processor of the system.

Alternatively or additionally, the values of the error status registers 420 may be provided as parallel signals 460 to a power management unit. The power management unit may be configured to, for example, power-down or reset individual sub-systems or the entire system, and/or adjust voltages of various power domains. In some implementations, firmware of the power-management unit may be programmed by a user to perform user-defined actions in response to various combinations of errors indicated by the error status registers.

In some implementations, the system may include masking circuits 430, which may be used to implement one or more user-defined hardware-based safety functions. The masking circuits 430 may be used, for example, to filter the errors indicated by the error status registers 420. For instance, the circuits may filter errors indicated by the error status registers 420 with a user-defined mask to produce a set of masked signals of interest. The user-defined mask may be specified, for example, within a set of configuration data used for configuration of a programmable logic sub-system. The user-defined mask may isolate a set of errors that may be used individually or together to trigger certain actions. For example, the masked error signals may be used to set control signals used by one or more hard-wired circuits in a programmable IC, such as a reset circuit. For instance, a logical OR gate may be used to trigger an action if any of the masked signals indicates an error. A logical AND gate may be used to trigger an action only if all of the masked signals indicate an error. Combinations of various logic gates may be used to create more complex triggers.

As shown in FIG. 4, masking circuits 430 may include a first user-configurable mask 432 that produces a first set of masked error signals 435. Logical OR gate 436 sets an error signal 438 to a value indicative of an error if any of the masked error signals 435 indicates an error or if SW error status signal 434 indicates an error. As another example, the masking circuits 430 may include a second user-configurable mask 440 that identifies a set of error signals 443 that are to trigger power-on reset of the system. A logical OR gate 444 may trigger power-on-reset (POR) of the system by setting POR request signal 446 to a logical 1 if any of the masked signals 443 indicate an error or if the SW reset request 442 is set to a logical 1. As yet another example, the masking circuits 430 may include a user-configurable mask 450 that identifies a set of error signals 452 that are to trigger a software reset of the system. A logical OR gate 454 triggers software reset by setting a SW reset request signal 456 to a logical 1 if any of the masked signals 452 indicate an error or if the SW reset request 442 is set to a logical 1.

In some implementations, the error status registers may include a shift circuit 422 configured to serially shift out the values of all of the registers to produce a serial status signal 424 that indicates the values of each of the error status registers 420. The serial status signal 424 may be output from the system, or may be provided to various circuits for error handling. For instance, in some implementations, the serial status signal 424 may be provided to an error handling circuit in programmable logic in lieu of parallel signals 462.

The methods and circuits are thought to be applicable to a variety of systems and applications. Other aspects and features will be apparent to those skilled in the art from consideration of the specification. For example, though aspects and features may in some cases be described in individual figures, it will be appreciated that features from one figure can be combined with features of another figure even though the combination is not explicitly shown or explicitly described as a combination. It is intended that the specification and drawings be considered as examples only, with a true scope of the invention being indicated by the following claims.

What is claimed is:

1. A programmable integrated circuit (IC), comprising:
  a programmable logic sub-system including a plurality of programmable logic circuits configured in response to a first subset of configuration data;
  a processing sub-system including one or more processing circuits configured to execute a software program in response to a second subset of configuration data; and
  a safety sub-system configured to perform safety functions that detect and/or mitigate errors in circuits of the programmable IC, wherein the safety sub-system includes:
    a set of hard-wired circuits configured to perform hardware-based safety functions for a first subset of circuits of the programmable IC; and
    a processing circuit configured to execute software-based safety functions for a second subset of circuits of the programmable IC.

2. The programmable IC of claim 1, wherein:
  the programmable IC is configured to store a safety policy included in a third subset of the configuration data in response to receiving the configuration data; and
  the safety policy identifies priorities for the circuits of the programmable IC, the first subset of circuits being identified as higher priority circuits, and the second subset of circuits being identified as lower priority circuits.

3. The programmable IC of claim 2, wherein the third subset of the configuration data specifies safety functions to be performed for each of the circuits of the programmable IC.

4. The programmable IC of claim 1, wherein the processing circuit includes at least two processors configured to perform one of the software-based safety functions in lockstep.

5. The programmable IC of claim 4, wherein at least one of the hardware-based safety functions performed by the set of hard-wired circuits is configured to determine whether or not the two processors are correctly operating in lockstep.

6. The programmable IC of claim 1, wherein:
the circuits of the programmable IC includes a memory circuit; and
a safety function performed by the safety sub-system for the memory circuit monitors integrity of data stored in the memory circuit using an error-correcting code.

7. The programmable IC of claim 1, wherein the programmable logic sub-system, the processing sub-system, and the safety sub-system are powered by separate power domains.

8. The programmable IC of claim 7, wherein:
the programmable IC includes a power management unit configured to regulate power in the power domains used to power the programmable logic sub-system, the processing sub-system, and the safety sub-system; and
a safety function performed by the safety sub-system for the power management unit monitors operation of the power management unit for errors using a triple modular redundant error detection circuit included in the set of hard-wired circuits.

9. The programmable IC of claim 7, wherein at least one of the safety functions performed by the safety sub-system is configured to reset one of the programmable logic or processing sub-systems of the programmable IC in response to detecting an error in the sub-system.

10. The programmable IC of claim 1, wherein at least one of the safety functions, performed by the safety sub-system for one circuit of the programmable IC, isolates communication data paths used by the one circuit from communication data paths used by other circuits of the programmable IC.

11. A method, comprising:
operating a hardware portion of a user design in a programmable logic sub-system of a programmable integrated circuit (IC);
executing a software portion of the user design on a processing sub-system of the programmable IC;
performing software-based safety functions using a set of processors of a safety sub-system of the programmable IC; and
performing hardware-based safety functions using a set of hard-wired circuits of the safety sub-system, wherein the software-based and hardware-based safety functions are configured to detect and/or mitigate errors in circuits of the programmable IC.

12. The method of claim 11, further comprising:
configuring the programmable logic sub-system with a set of configuration data to form the hardware portion of the user design; and
storing a safety policy included in a subset of the set of configuration data in a memory of the safety sub-system, the safety policy indicating the at least one of the hardware-based or software-based safety functions.

13. The method of claim 12, wherein:
the safety policy classifies the circuits of the programmable IC as high priority or low priority;
the software-based safety functions detect and/or mitigate errors in circuits of the programmable IC that are classified as low priority; and
the hardware-based safety functions detect and/or mitigate errors in circuits of the programmable IC that are classified as high priority.

14. The method of claim 11, wherein at least one of the software-based safety functions is performed using at least two processors of the set of processors operated in lockstep.

15. The method of claim 14, wherein at least one of the hardware-based safety functions is configured to determine whether or not the at least two processors are correctly operated in lockstep.

16. The method of claim 11, wherein:
the circuits of the programmable IC include a memory circuit; and
performing at least one of the software-based or hardware-based safety functions includes monitoring integrity of data stored in the memory circuit using an error-correcting code.

17. The method of claim 11, further comprising:
powering the programmable logic sub-system, the processing sub-system, and the safety sub-system using separate power domains.

18. The method of claim 17, further comprising:
regulating power in the separate power domains using a power management unit of the programmable IC, and
wherein performing the hardware-based safety functions includes monitoring operation of the power management unit for errors using a triple modular redundant error detection circuit included in the set of hard-wired circuits.

19. The method of claim 17, wherein at least one of the software-based or hardware-based safety functions is configured to reset one of the programmable logic or processing sub-systems of the programmable IC in response to detecting an error in the sub-system.

20. The method of claim 11, wherein at least one of the software-based or hardware-based safety functions is configured to isolate communication data paths used by one of the circuits of the programmable IC from communication data paths used by other circuits of the programmable IC.

* * * * *